(12) United States Patent
Kreuzer

(10) Patent No.: US 11,632,097 B2
(45) Date of Patent: Apr. 18, 2023

(54) COUPLED RESONATOR FILTER DEVICE

(71) Applicant: Qorvo US, Inc., Greensboro, NC (US)

(72) Inventor: Susanne Kreuzer, Sorrento, FL (US)

(73) Assignee: Qorvo US, Inc., Greensboro, NC (US)

( * ) Notice: Subject to any disclaimer, the term of this patent is extended or adjusted under 35 U.S.C. 154(b) by 237 days.

(21) Appl. No.: 17/088,872

(22) Filed: Nov. 4, 2020

(65) Prior Publication Data

US 2022/0140817 A1  May 5, 2022

(51) Int. Cl.
*H03H 9/58* (2006.01)
*H03H 9/54* (2006.01)
*H03H 9/17* (2006.01)

(52) U.S. Cl.
CPC ............ *H03H 9/584* (2013.01); *H03H 9/175* (2013.01); *H03H 9/542* (2013.01)

(58) Field of Classification Search
CPC ......... H03H 9/584; H03H 9/175; H03H 9/542
See application file for complete search history.

(56) References Cited

U.S. PATENT DOCUMENTS

| | | |
|---|---|---|
| 3,731,230 A | 5/1973 | Cerny, Jr. |
| 3,875,533 A | 4/1975 | Irwin et al. |
| 4,442,434 A | 4/1984 | Baekgaard |
| 4,577,168 A | 3/1986 | Hailmann |
| 5,291,159 A | 3/1994 | Vale |
| 5,821,833 A | 10/1998 | Lakin |
| 6,067,391 A | 5/2000 | Land |
| 6,670,866 B2 | 12/2003 | Ellaet et al. |
| 6,714,099 B2 | 3/2004 | Hikita et al. |
| 6,720,844 B1 | 4/2004 | Lakin |
| 6,927,649 B2 | 8/2005 | Metzger et al. |

(Continued)

FOREIGN PATENT DOCUMENTS

| | | |
|---|---|---|
| CN | 111917392 A | 11/2020 |
| JP | 2002251190 A | 9/2002 |

(Continued)

OTHER PUBLICATIONS

Non-Final Office Action for U.S. Appl. No. 14/757,587, dated Sep. 13, 2016, 12 pages.

(Continued)

*Primary Examiner* — Dinh T Le
(74) *Attorney, Agent, or Firm* — Withrow & Terranova, P.L.L.C.

(57) ABSTRACT

A coupled resonator filter device is disclosed. The coupled resonator filter device includes a substrate with one or more acoustic reflector layers disposed over the substrate, a first lower electrode disposed over the one or more acoustic reflector layers, a first piezoelectric layer disposed over the first lower electrode, and a first upper electrode disposed over the first piezoelectric layer. The coupled resonator filter device further includes one or more acoustic coupling layers disposed over the first upper electrode, a second lower electrode disposed over the one or more acoustic coupling layers, a second piezoelectric layer disposed over the second lower electrode, a second upper electrode disposed over the second piezoelectric layer, and a first tuning capacitor having a first upper plate coupled to the first upper electrode and a first lower plate coupled to the first lower electrode.

23 Claims, 8 Drawing Sheets

(56) References Cited

U.S. PATENT DOCUMENTS

| | | |
|---|---|---|
| 6,927,651 B2 | 8/2005 | Larson, III et al. |
| 6,975,183 B2 | 12/2005 | Aigner et al. |
| 7,057,478 B2 | 6/2006 | Korden et al. |
| 7,173,504 B2 | 2/2007 | Larson, III et al. |
| 7,239,067 B2 | 7/2007 | Komuro et al. |
| 7,321,183 B2 | 1/2008 | Ebuchi et al. |
| 7,342,351 B2 | 3/2008 | Kubo et al. |
| 7,367,095 B2 | 5/2008 | Larson, III et al. |
| 7,391,285 B2 | 6/2008 | Larson, III et al. |
| 7,436,269 B2 | 10/2008 | Wang et al. |
| 7,515,018 B2 | 4/2009 | Handtmann et al. |
| 7,804,374 B1 | 9/2010 | Brown et al. |
| 7,825,749 B2 | 11/2010 | Thalhammer et al. |
| 7,855,618 B2 | 12/2010 | Frank et al. |
| 7,889,024 B2 | 2/2011 | Bradley et al. |
| 7,898,493 B1 | 3/2011 | Rojas et al. |
| 7,956,705 B2 | 6/2011 | Meister et al. |
| 7,973,620 B2 | 7/2011 | Shirakawa et al. |
| 8,248,185 B2 | 8/2012 | Choy et al. |
| 8,508,315 B2 | 8/2013 | Jamneala et al. |
| 8,575,820 B2 | 11/2013 | Shirakawa et al. |
| 8,576,024 B2 | 11/2013 | Erb et al. |
| 8,923,794 B2 | 12/2014 | Aigner |
| 8,981,627 B2 | 3/2015 | Sakuma et al. |
| 8,991,022 B2 | 3/2015 | Satoh et al. |
| 9,054,671 B2 | 6/2015 | Adkisson et al. |
| 9,054,674 B2 | 6/2015 | Inoue et al. |
| 9,197,189 B2 | 11/2015 | Miyake |
| 9,243,316 B2 | 1/2016 | Larson, III et al. |
| 9,484,883 B2 | 11/2016 | Nishizawa et al. |
| 9,698,756 B2 | 7/2017 | Khlat et al. |
| 9,837,984 B2 | 12/2017 | Khlat et al. |
| 9,847,769 B2 | 12/2017 | Khlat et al. |
| 9,887,686 B2 | 2/2018 | Kuwahara |
| 9,929,716 B2 | 3/2018 | Lee et al. |
| 10,009,001 B2 | 6/2018 | Jiang et al. |
| 10,141,644 B2 | 11/2018 | Khlat et al. |
| 2002/0109564 A1 | 8/2002 | Tsai et al. |
| 2004/0100342 A1 | 5/2004 | Nishihara et al. |
| 2004/0263286 A1 | 12/2004 | Unterberger |
| 2005/0057117 A1 | 3/2005 | Nakatsuka et al. |
| 2005/0093648 A1 | 5/2005 | Inoue |
| 2005/0206476 A1 | 9/2005 | Ella et al. |
| 2006/0091978 A1 | 5/2006 | Wang et al. |
| 2008/0007369 A1 | 1/2008 | Barber et al. |
| 2008/0169884 A1 | 7/2008 | Matsumoto et al. |
| 2008/0272853 A1 | 11/2008 | Heinze et al. |
| 2008/0297278 A1 | 12/2008 | Handtmann et al. |
| 2009/0096549 A1 | 4/2009 | Thalhammer et al. |
| 2009/0096550 A1 | 4/2009 | Handtmann et al. |
| 2010/0277237 A1 | 11/2010 | Sinha et al. |
| 2011/0115334 A1 | 5/2011 | Konishi et al. |
| 2011/0121689 A1 | 5/2011 | Grannen et al. |
| 2011/0204995 A1 | 8/2011 | Jamneala et al. |
| 2011/0210787 A1 | 9/2011 | Lee et al. |
| 2012/0007696 A1 | 1/2012 | Pang et al. |
| 2012/0187799 A1 | 7/2012 | Nakahashi |
| 2012/0313725 A1 | 12/2012 | Ueda et al. |
| 2013/0033150 A1 | 2/2013 | Bardong et al. |
| 2013/0113576 A1 | 5/2013 | Inoue et al. |
| 2013/0193808 A1 | 8/2013 | Feng et al. |
| 2014/0085020 A1* | 3/2014 | Reinhardt ................ H03H 3/04 333/188 |
| 2014/0125203 A1 | 5/2014 | Choy et al. |
| 2014/0132117 A1 | 5/2014 | Larson, III |
| 2014/0145557 A1 | 5/2014 | Tanaka |
| 2014/0167565 A1 | 6/2014 | Iwamoto |
| 2015/0054387 A1* | 2/2015 | Li .................... H01L 41/098 310/365 |
| 2015/0222246 A1 | 8/2015 | Nosaka |
| 2015/0280100 A1 | 10/2015 | Burak et al. |
| 2015/0369153 A1 | 12/2015 | Tsunooka et al. |
| 2016/0028364 A1 | 1/2016 | Takeuchi |
| 2016/0056789 A1 | 2/2016 | Otsubo et al. |
| 2016/0191012 A1 | 6/2016 | Khlat et al. |
| 2016/0191014 A1 | 6/2016 | Khlat et al. |
| 2016/0191016 A1 | 6/2016 | Khlat et al. |
| 2016/0261235 A1 | 9/2016 | Ortiz |
| 2016/0268998 A1 | 9/2016 | Xu et al. |
| 2016/0308576 A1 | 10/2016 | Khlat et al. |
| 2016/0359468 A1 | 12/2016 | Taniguchi et al. |
| 2017/0093369 A1 | 3/2017 | Khlat et al. |
| 2017/0093370 A1 | 3/2017 | Khlat et al. |
| 2017/0141757 A1 | 5/2017 | Schmidhammer |
| 2017/0201233 A1 | 7/2017 | Khlat |
| 2017/0301992 A1 | 10/2017 | Khlat et al. |
| 2017/0310302 A1 | 10/2017 | Bauder et al. |
| 2017/0324159 A1 | 11/2017 | Khlat |
| 2017/0338795 A1 | 11/2017 | Nakagawa et al. |
| 2018/0013402 A1 | 1/2018 | Kirkpatrick et al. |
| 2018/0041191 A1 | 2/2018 | Park |
| 2018/0076793 A1 | 3/2018 | Khlat et al. |
| 2018/0076794 A1 | 3/2018 | Khlat et al. |
| 2018/0109236 A1 | 4/2018 | Konoma |
| 2018/0109237 A1 | 4/2018 | Wasilik et al. |
| 2018/0145658 A1 | 5/2018 | Saji |
| 2018/0219530 A1 | 8/2018 | Khlat et al. |
| 2018/0241418 A1 | 8/2018 | Takamine et al. |
| 2018/0358947 A1 | 12/2018 | Mateu et al. |
| 2019/0103851 A1 | 4/2019 | Yusuf |
| 2019/0140618 A1 | 5/2019 | Takamine |
| 2019/0181824 A1* | 6/2019 | Timme .................... H04B 1/18 |
| 2019/0181835 A1 | 6/2019 | Timme et al. |
| 2019/0199320 A1 | 6/2019 | Morita et al. |
| 2019/0207583 A1 | 7/2019 | Miura et al. |
| 2019/0222197 A1 | 9/2019 | Saji |
| 2019/0288664 A1 | 9/2019 | Saji |
| 2019/0305752 A1 | 10/2019 | Sadhu et al. |
| 2021/0028755 A1 | 1/2021 | Yusuf |
| 2021/0211116 A1 | 7/2021 | Khlat |
| 2021/0218385 A1 | 7/2021 | Yusuf et al. |
| 2021/0218386 A1 | 7/2021 | Yusuf et al. |
| 2022/0069800 A1 | 3/2022 | Han et al. |

FOREIGN PATENT DOCUMENTS

| | | |
|---|---|---|
| JP | 2008085989 A | 4/2008 |
| JP | 2011176744 A | 9/2011 |
| JP | 2012257050 A | 12/2012 |
| JP | 2017103654 A | 6/2017 |
| JP | 2018093388 A | 6/2018 |

OTHER PUBLICATIONS

Notice of Allowance for U.S. Appl. No. 14/757,587, dated Mar. 9, 2017, 8 pages.

Non-Final Office Action for U.S. Appl. No. 15/004,084, dated Jun. 12, 2017, 9 pages.

Non-Final Office Action for U.S. Appl. No. 14/757,651, dated Jun. 9, 2017, 11 pages.

Non-Final Office Action for U.S. Appl. No. 15/275,957, dated Jun. 14, 2017, 9 pages.

Ex Parte Quayle Action for U.S. Appl. No. 15/347,452, mailed Jun. 15, 2017, 7 pages.

Final Office Action for U.S. Appl. No. 15/275,957, dated Jan. 2, 2018, 7 pages.

Author Unknown, "SAW Filters—SAW Resonators: Surface Acoustic Wave SAW Components," Product Specification, 2010, Token Electronics Industry Co., Ltd., 37 pages.

Fattinger, Gernot et al., "Miniaturization of BAW Devices and the Impact of Wafer Level Packaging Technology," Joint UFFC, EFTF and PFM Symposium, Jul. 21-25, 2013, Prague, Czech Republic, IEEE, pp. 228-231.

Kwa, Tom, "Wafer-Level Packaged Accelerometer With Solderable SMT Terminals," IEEE Sensors, Oct. 22-25, 2006, Daegu, South Korea, IEEE, pp. 1361-1364.

Lakin, K. M., "Coupled Resonator Filters," 2002 IEEE Ultrasonics Symposium, Oct. 8-11, 2002, Munich, Germany, 8 pages.

López, Edén Corrales, "Analysis and Design of Bulk Acoustic Wave Filters Based on Acoustically Coupled Resonators," PhD Thesis,

(56) References Cited

OTHER PUBLICATIONS

Department of Telecommunications and Systems Engineering, Autonomous University of Barcelona, May 2011, 202 pages.
Potter, Bob R. et al., "Embedded Inductors Incorporated in the Design of SAW Module SMT Packaging," Proceedings of the 2002 Ultrasonics Symposium, Oct. 8-11, 2002, IEEE, pp. 397-400.
Schneider, Robert, "High-Q AlN Contour Mode Resonators with Unattached, Voltage-Actuated Electrodes," Thesis, Technical Report No. UCB/EECS-2015-247, Dec. 17, 2015, Electrical Engineering and Computer Sciences, University of California at Berkeley, http://www.eecs.berkeley.edu/Pubs/TechRpts/2015/EECS-2015-247.html, Robert Anthony Schneider, 222 pages.
Shirakawa, A. A., et al., "Bulk Acoustic Wave-Coupled Resonator Filters: Concept, Design, and Application," International Journal of RF and Microwave Computer-Aided Engineering, vol. 21, No. 5, Sep. 2011, 9 pages.
Corrales, Eden, et al., "Design of Three-Pole Bulk Acoustic Wave Coupled Resonator Filters," 38th European Microwave Conference, Oct. 2008, Amsterdam, Nethedands, EuMA, pp. 357-360.
De Paco, Pedro, et al., "Equivalent Circuit Modeling of Coupled Resonator Filters," Transactions on Ultrasonics, Ferroelectrics, and Frequency Control, vol. 55, Issue 9, Sep. 2008, IEEE, pp. 2030-2037.
Lakin, K. M., "Bulk Acoustic Wave Coupled Resonator Filters," International Frequency Control Symposium, 2002, IEEE, pp. 8-14.
Shirakawa, A. A., et al., "Bulk Acoustic Wave Coupled Resonator Filters Synthesis Methodology," European Microwave Conference, Oct. 4-6, 2005, Paris, France, IEEE, 4 pages.
Tosic, Dejan, et al., "Symbolic analysis of immitance inverters," 14th Telecommunications Forum, Nov. 21-23, 2006, Belgrade, Serbia, pp. 584-487.
Non-Final Office Action for U.S. Appl. No. 14/757,651, dated May 8, 2018, 8 pages.
Notice of Allowance for U.S. Appl. No. 15/347,428, dated Jul. 12, 2018, 9 pages.
Notice of Allowance for U.S. Appl. No. 15/490,381, dated May 23, 2018, 8 pages.
Final Office Action for U.S. Appl. No. 14/757,651, dated Sep. 19, 2018, 7 pages.
Non-Final Office Action for U.S. Appl. No. 15/701,759, dated Oct. 4, 2018, 10 pages.
Notice of Allowance for U.S. Appl. No. 15/727,117, dated Mar. 13, 2019, 9 pages.
Non-Final Office Action for U.S. Appl. No. 15/586,374, dated Feb. 26, 2019, 16 pages.
Notice of Allowance for U.S. Appl. No. 15/720,706, dated Mar. 15, 2019, 9 pages.
Non-Final Office Action for U.S. Appl. No. 15/697,658, dated May 1, 2019, 13 pages.
Larson, John, et al., "Characterization of Reversed c-axis AlN Thin Films," International Ultrasonics Symposium Proceedings, 2010, IEEE, pp. 1054-1059.
Notice of Allowance for U.S. Appl. No. 15/586,374, dated Oct. 4, 2019, 7 pages.
Notice of Allowance for U.S. Appl. No. 15/644,922, dated Oct. 21, 2019, 10 pages.
Final Office Action for U.S. Appl. No. 15/697,658, dated Oct. 22, 2019, 9 pages.
Non-Final Office Action for U.S. Appl. No. 15/883,933, dated Oct. 25, 2019, 19 pages.
Non-Final Office Action for U.S. Appl. No. 16/003,417, dated Apr. 3, 2020, 9 pages.
Capilla, Jose et al., "High-Acoustic-Impedence Tantalum Oxide Layers for Insulating Acoustic Reflectors," IEEE Transactions on Ultrasonics, Ferroelectrics, and Frequency Control, vol. 59, No. 3, Mar. 2012, IEEE, pp. 366-372.
Fattinger, Gernot et al., "Single-to-balanced Filters for Mobile Phones using Coupled Resonator BAW Technology," 2004 IEEE International Ultrasonics, Ferroelectrics,and Frequency Control Joint 50th Anniversary Conference, Aug. 23-27, 2004, IEEE, pp. 416-419.
Lakin, K. M. et al., "High Performance Stacked Crystal Filters for GPS and Wide Bandwidth Applications," 2001 IEEE Ultrasonics Symposium, Oct. 7-10, 2001, IEEE, pp. 833-838.
Roy, Ambarish et al., "Spurious Modes Suppression in Stacked Crystal Filter," 2010 IEEE Long Island Systems, Applications and Technology Conference, May 7, 2010, 6 pages.
Non-Final Office Action for U.S. Appl. No. 16/290,175, dated Apr. 14, 2020, 29 pages.
Ibrahim, A. et al., "Compact Size Microstrip Coupled Resonator Band Pass Filter Loaded with Lumped Capacitors," 2013 Second International Japan-Egypt Conference on Electronics, Communications and Computers (JEC-ECC), Dec. 17-19, 2013, Egypt, IEEE, 4 pages.
Tsai, H. et al., "Tunable Filter by FBAR Using Coupling Capacitors," Proceedings of the 2018 Asia-Pacific Microwave Conference (APMC), Nov. 6-9, 2018, Kyoto, Japan, IEICE, pp. 609-611.
Zhu, L. et al., "Adjustable Bandwidth Filter Design Based on Interdigital Capacitors," IEEE Microwave and Wireless Components Letters, vol. 18, No. 1, Jan. 2008, IEEE, pp. 16-18.
Non-Final Office Action for U.S. Appl. No. 16/283,044, dated Nov. 12, 2020, 9 pages.
Notice of Allowance for U.S. Appl. No. 15/697,658, dated Nov. 17, 2020, 7 pages.
Final Office Action for U.S. Appl. No. 15/883,933, dated Oct. 23, 2020, 15 pages.
Advisory Action for U.S. Appl. No. 15/883,933, dated Dec. 31, 2020, 3 pages.
Notice of Allowance and Examiner-Initiated Interview Summary for U.S. Appl. No. 16/003,417, dated Aug. 5, 2020, 9 pages.
Final Office Action for U.S. Appl. No. 16/290,175, dated Sep. 17, 2020, 13 pages.
Non-Final Office Action for U.S. Appl. No. 16/290,175, dated Jan. 6, 2021, 14 pages.
Mgner, R et al., "3G-4G-5G: How BAW Filter Technology Enables a Connected World," 20th International Conference on Solid-State Sensors, Actuators and Microsystems & Eurosensors XXXIII (Transducers & Eurosensors XXXIII), Jun. 23-27, 2019, Berlin, Germany, IEEE, pp. 523-526.
Kreuzer, S. et al., "Full band 41 filter with high Wi-Fi rejection—design and manufacturing challenges," IEEE International Ultrasonics Symposium (IUS), Oct. 21-24, 2015, Taipei, Taiwan, IEEE, 4 pages.
Volatier, A. et al., "Technology enhancements for high performance BAW duplexer," IEEE International Ultrasonics Symposium (IUS), Jul. 21-25, 2013, Prague, Czech Republic, IEEE, pp. 761-764.
Non-Final Office Action for U.S. Appl. No. 16/358,823, dated Apr. 5, 2021, 12 pages.
Non-Final Office Action for U.S. Appl. No. 15/883,933, dated Mar. 29, 2021, 11 pages.
Non-Final Office Action for U.S. Appl. No. 16/740,667, dated Mar. 4, 2021, 10 pages.
Non-Final Office Action for U.S. Appl. No. 16/776,738, dated Mar. 4, 2021, 7 pages.
Non-Final Office Action for U.S. Appl. No. 16/806,166, dated Mar. 18, 2021, 6 pages.
Notice of Allowance for U.S. Appl. No. 16/290,175, dated Jun. 14, 2021, 7 pages.
Corrected Notice of Allowability for U.S. Appl. No. 16/290,175, dated Jun. 23, 2021, 4 pages.
Notice of Allowance for U.S. Appl. No. 16/740,667, dated Jun. 11, 2021, 7 pages.
Notice of Allowance for U.S. Appl. No. 16/776,738, dated Jun. 11, 2021, 7 pages.
Notice of Allowance for U.S. Appl. No. 16/806,166, dated Jun. 18, 2021, 7 pages.
Moreira, M. et al., "Aluminum scandium nitride thin-film bulk acoustic resonators for wide band applications," Vacuum, vol. 86, Issue 1, Jul. 2011, Elsevier Ltd., 4 pages.
Non-Final Office Action for U.S. Appl. No. 17/152,110, dated May 27, 2022, 6 pages.

(56) References Cited

OTHER PUBLICATIONS

Extended European Search Report for European Patent Application No. 22150239.6, dated Jun. 9, 2022, 10 pages.
Notice of Allowance and Examiner-Initiated Interview Summary for U.S. Appl. No. 16/722,125, dated Jun. 24, 2022, 10 pages.
Office Action for Japanese Patent Application No. 2018181230, dated Sep. 14, 2022, 9 pages.
Notice of Allowance for U.S. Appl. No. 17/152,110, dated Sep. 21, 2022, 7 pages.

* cited by examiner

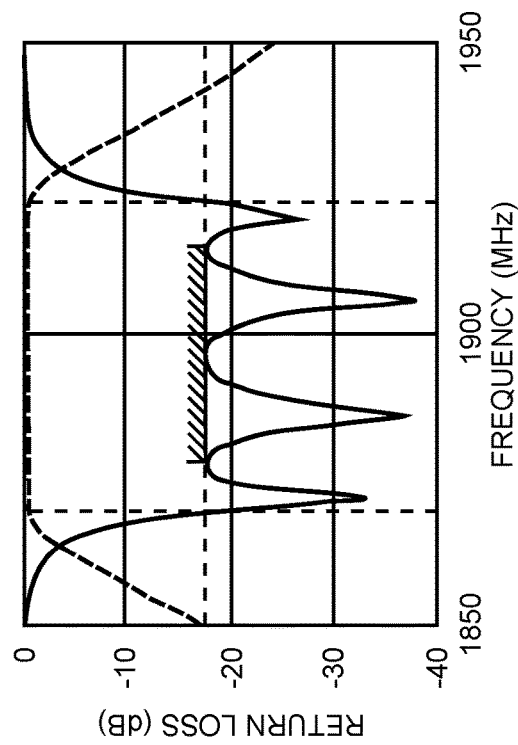
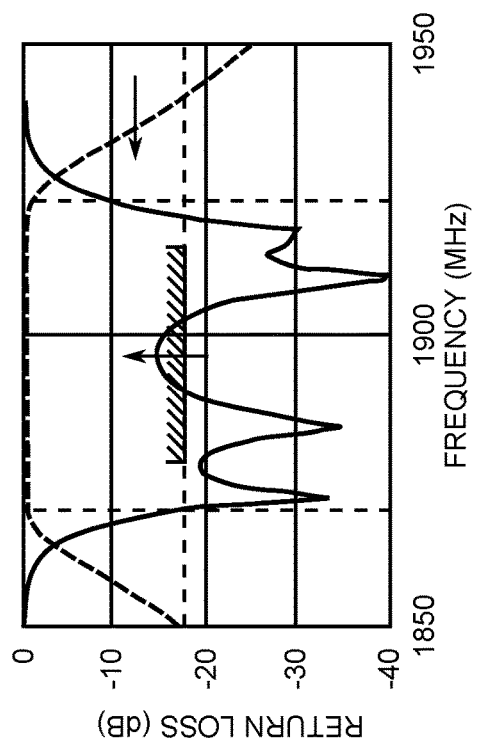
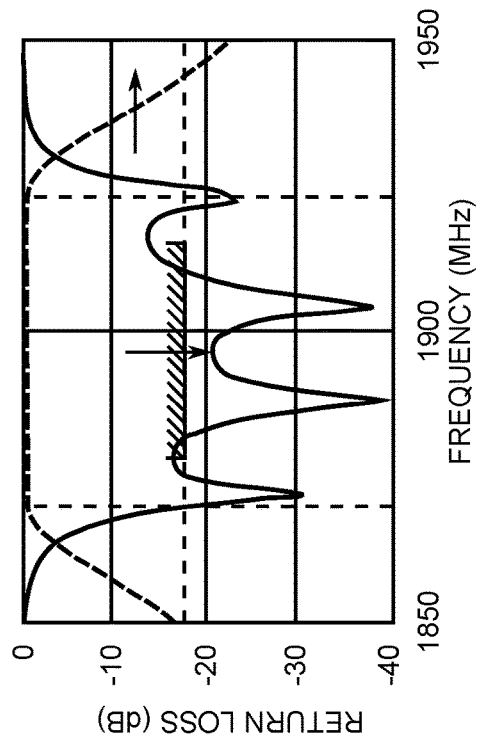
FIG. 5A
FIG. 5B
FIG. 5C

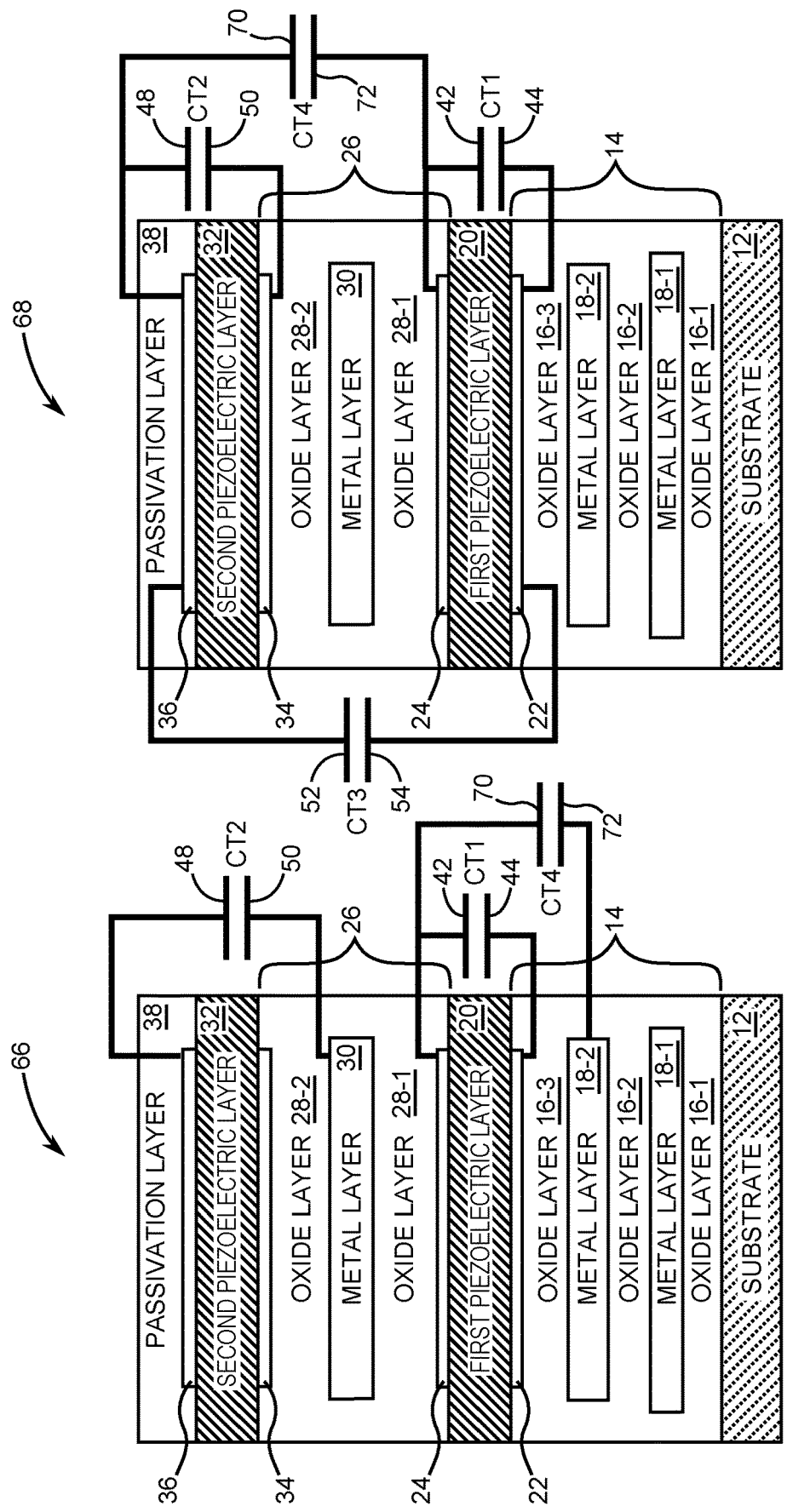

US 11,632,097 B2

COUPLED RESONATOR FILTER DEVICE

FIELD OF THE DISCLOSURE

The present disclosure relates to electromechanical components utilizing acoustic wave propagation in piezoelectric layers and in particular to acoustic wave filters that may be used, for example, in radio frequency transmission circuits, sensor systems, and signal processing systems.

BACKGROUND

In contrast to typical bulk acoustic wave filters, where it is sufficient to trim only the top most layers to achieve optimal device performance, various layers in a coupled resonator filter (CRF) stack affect a filter's characteristics such as frequency position, bandwidth, and return loss performance. However, layers within the CRF stack cannot be trimmed directly using the filter response since they are buried in the CRF stack. Moreover, the probed response at the time the CRF layers are deposited does not exhibit an ultimate filter shape. Thus, trimming the CRF highly relies on accurate knowledge of the stack thicknesses and precise modelling. To assure high-yield production for CRF, the control of layer thickness variation is indispensable since trimming after final process is not possible for all filter characteristics.

SUMMARY

A coupled resonator filter device is disclosed. The coupled resonator filter device includes a substrate with one or more acoustic reflector layers disposed over the substrate, a first lower electrode disposed over the one or more acoustic reflector layers, a first piezoelectric layer disposed over the first lower electrode, and a first upper electrode disposed over the first piezoelectric layer. The coupled resonator filter device further includes one or more acoustic coupling layers disposed over the first upper electrode, a second lower electrode disposed over the one or more acoustic coupling layers, a second piezoelectric layer disposed over the second lower electrode, a second upper electrode disposed over the second piezoelectric layer, and a first tuning capacitor having a first upper plate coupled to the first upper electrode and a first lower plate coupled to the first lower electrode.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIG. 5A is a graph depicting target filter frequency position and return loss for a coupled resonator filter for a target tuning capacitance of a first tuning capacitor coupled across electrodes of a first piezoelectric layer buried within the coupled resonator filter.

FIG. 5B is a graph showing an example of the impact of a lower than target tuning capacitance of the first tuning capacitor.

FIG. 5C is a graph showing an example of the impact of a higher than target tuning capacitance of the first tuning capacitor.

FIG. 8A is a diagram of a cross-section of a third exemplary embodiment coupled resonator filter device depicting tuning capacitor connections in accordance with the present disclosure.

FIG. 8B is a diagram of a cross-section of a fourth exemplary embodiment coupled resonator filter device depicting tuning capacitor connections in accordance with the present disclosure.

DETAILED DESCRIPTION

Figure 1C:
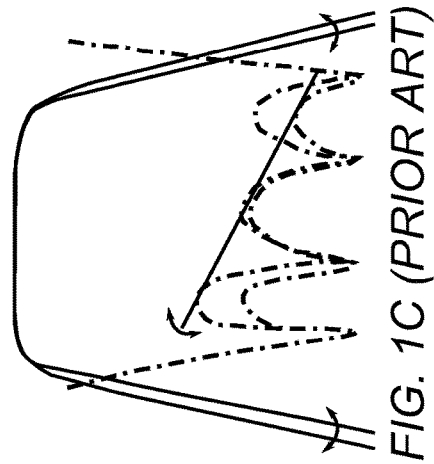
FIG. 1C is a graph of return loss variation over process for the related-art coupled resonator filter device of FIG. 1A.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1A:
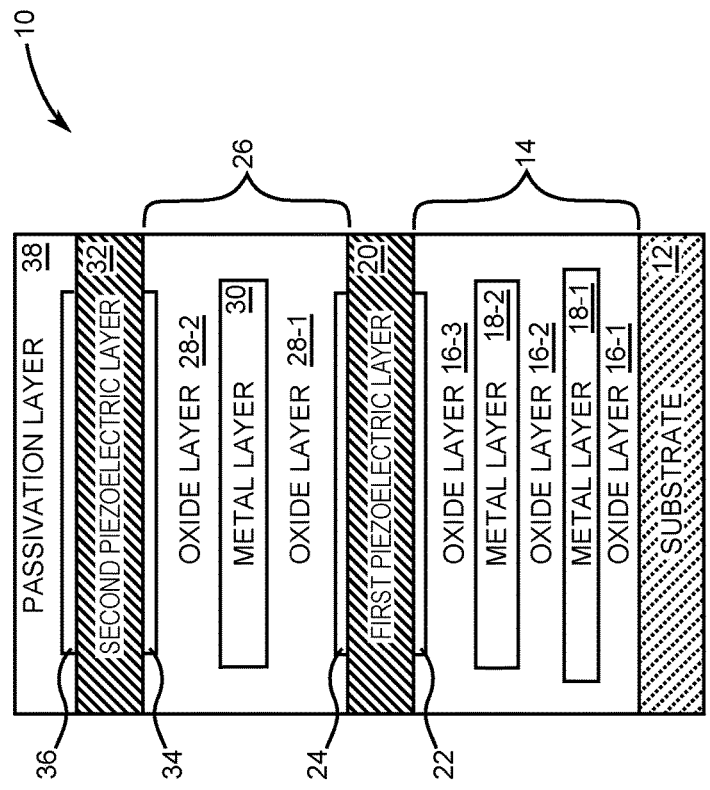
FIG. 1A is a diagram of a cross-section of a related-art coupled resonator filter device.

A radio frequency filter is a device that attenuates undesired radio frequency signals while allowing desired radio frequency signals to pass through the radio frequency filter. FIG. 1A is a diagram of a cross-section of a related-art coupled resonator filter device 10. The coupled resonator filter device 10 includes a substrate 12 with acoustic reflector layers 14 disposed over the substrate 12. In the related-art example of FIG. 1A, the acoustic reflector layers 14 include oxide layers 16-1, 16-2, and 16-3 that sandwich two metal layers 18-1 and 18-2. A first lower electrode 22 is disposed over the acoustic reflector layers 14, and a first piezoelectric layer 20 is disposed over the first lower electrode 22. A first upper electrode 24 is disposed over the first piezoelectric layer 20. The coupled resonator filter device 10 further includes acoustic coupling layers 26 disposed over the first upper electrode 24. The acoustic coupling layers 26 include oxide layers 28-1 and 28-2 that sandwich a metal layer 30. A second lower electrode 34 is disposed over the acoustic coupling layers 26. A second piezoelectric layer 32 is disposed over the second lower electrode 34. A second upper electrode 36 is disposed over the second piezoelectric layer 32, and a passivation layer 38 is disposed over the second upper electrode 36. Materials for the passivation layer 38 making up the dielectric include oxides and nitrides. An example of an oxide is silicon dioxide, and an example of a nitride is silicon nitride.

Figure 1B:
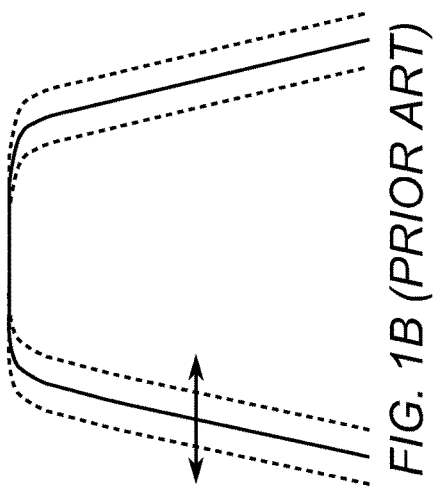
FIG. 1B is a graph of filter frequency position shifts over process variations for the related-art coupled resonator filter device of FIG. 1A.

In contrast to a traditional bulk acoustic wave (BAW) device, the acoustic reflector layers 14, the first piezoelectric layer 20, the acoustic coupled layers 26, and the second piezoelectric layer 32 affect characteristics of the coupled resonator filter device 10. The characteristics include frequency position and bandwidth variations as depicted in FIG. 1B and return loss performance as depicted in FIG. 1C. However, the acoustic reflector layers 14, the first piezoelectric layer 20, the acoustic coupled layers 26, and the second piezoelectric layer 32 cannot be trimmed directly using the filter response since they are inaccessible because they are buried between the substrate 12 and the passivation layer 38. Moreover, a probed response at the time those layers are deposited does not exhibit a final filter shape yet. Thus, trimming the filter response of the related-art coupled resonator filter device 10 relies practically exclusively on accurate knowledge of the thicknesses of the acoustic reflector layers 14, the first piezoelectric layer 20, the acoustic coupled layers 26, and the second piezoelectric layer 32 and on precise modelling. To assure high-yield production for the related-art coupled resonator filter device 10, the control of layer thickness variation is indispensable since trimming filter response after final fabrication processes is not possible for all filter characteristics. Thus, there is an unmet need for a coupled resonator filter device structure that provides for trimming filter response during or after final fabrication process steps.

Figure 2A:
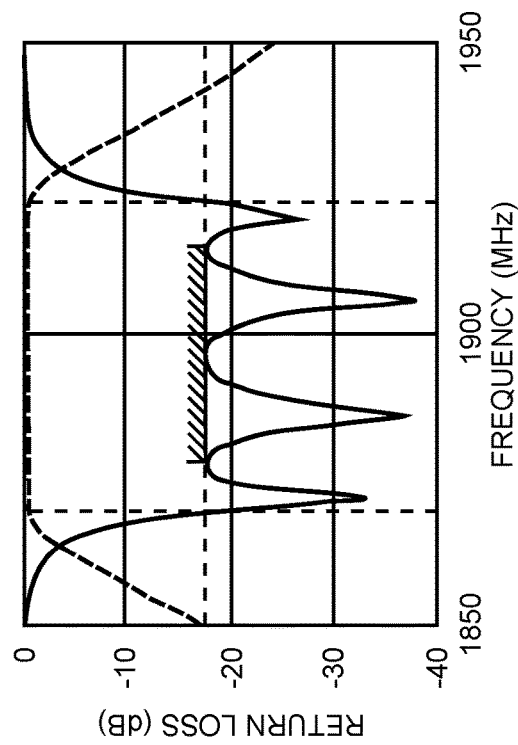
FIG. 2A is a graph depicting target filter frequency position and return loss for an ideal thickness of a second coupling layer of acoustic coupling layers of the related-art coupled resonator filter device of FIG. 1A.
Figure 2C:
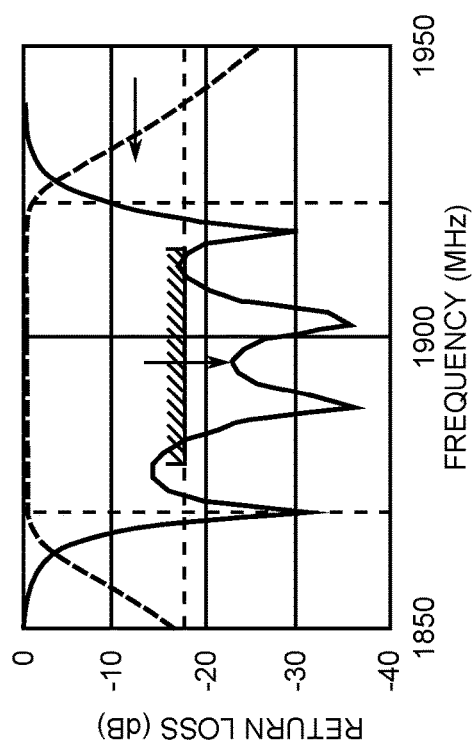
FIG. 2C is a graph showing an example of the impact of a thicker than target thickness of the second coupling layer.
Figure 2B:
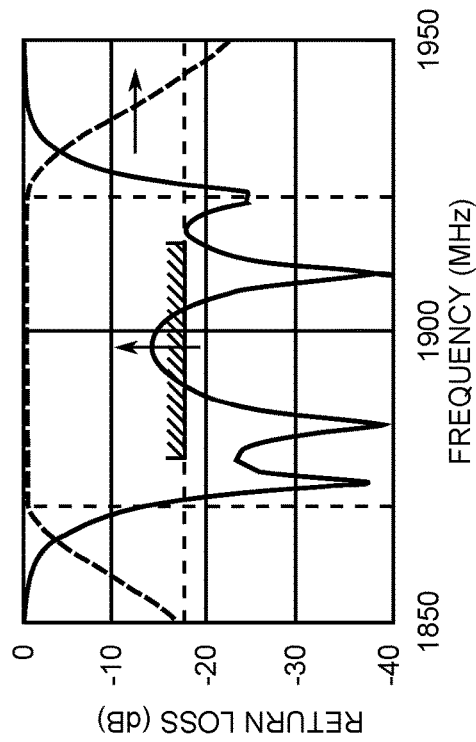
FIG. 2B is a graph showing an example of the impact of a thinner than target thickness of the second coupling layer.

The present disclosure provides a coupled resonator filter device structure for improving the return loss and bandwidth performance and variation by using a tunable capacitor that can adjust the return loss (RL) and bandwidth after the fact (after all layers are processed) using a direct filter feedback. FIGS. 2A, 2B, and 2C show examples of the impact of thickness variation of the metal layer 30 in the acoustic coupling layers 26. FIG. 2A is a graph depicting target filter frequency position and return loss for an ideal thickness of the metal layer 30 of the acoustic coupling layers 26 of the related-art coupled resonator filter device 10 of FIG. 1A.

As shown in FIG. 2B, if the metal layer 30 deviates from the target value and gets too thin such a −20 nm below target, the center return loss lobe rises and the bandwidth of the coupled resonator filter device 10 becomes wider. Furthermore, upper and lower return loss lobes drop in level and become unbalanced. Adjusting dimensions of the second upper electrode 36 and/or the passivation layer 38 can adjust the imbalances in the return loss side lobes. However, adjusting the dimensions of the second upper electrode 36 and/or the passivation layer 38 cannot improve the position and bandwidth of the center lobe. In contrast, as depicted in FIG. 2C, when the metal layer 30 becomes 20 nm thicker than the target value, the bandwidth shrinks and the center lobe level drops, whereas the upper and lower return loss lobes rise. The thickness variation of ±20 nm used in this example is a realistic assumption over the wafer and lot-to-lot thicknesses on a fabrication process run of coupled resonator filter devices such as related-art coupled resonator filter device 10 (FIG. 1A). Thus, by changing the thickness of the metal layer 30, acoustic boundary conditions in the acoustic coupling layers 26 are changed, and the coupling behavior from the second piezoelectric layer 32 to the first piezoelectric layer 20 is different over frequency. This change in coupling behavior impacts both the bandwidth and the return loss performance.

Figures 3A, 3B:
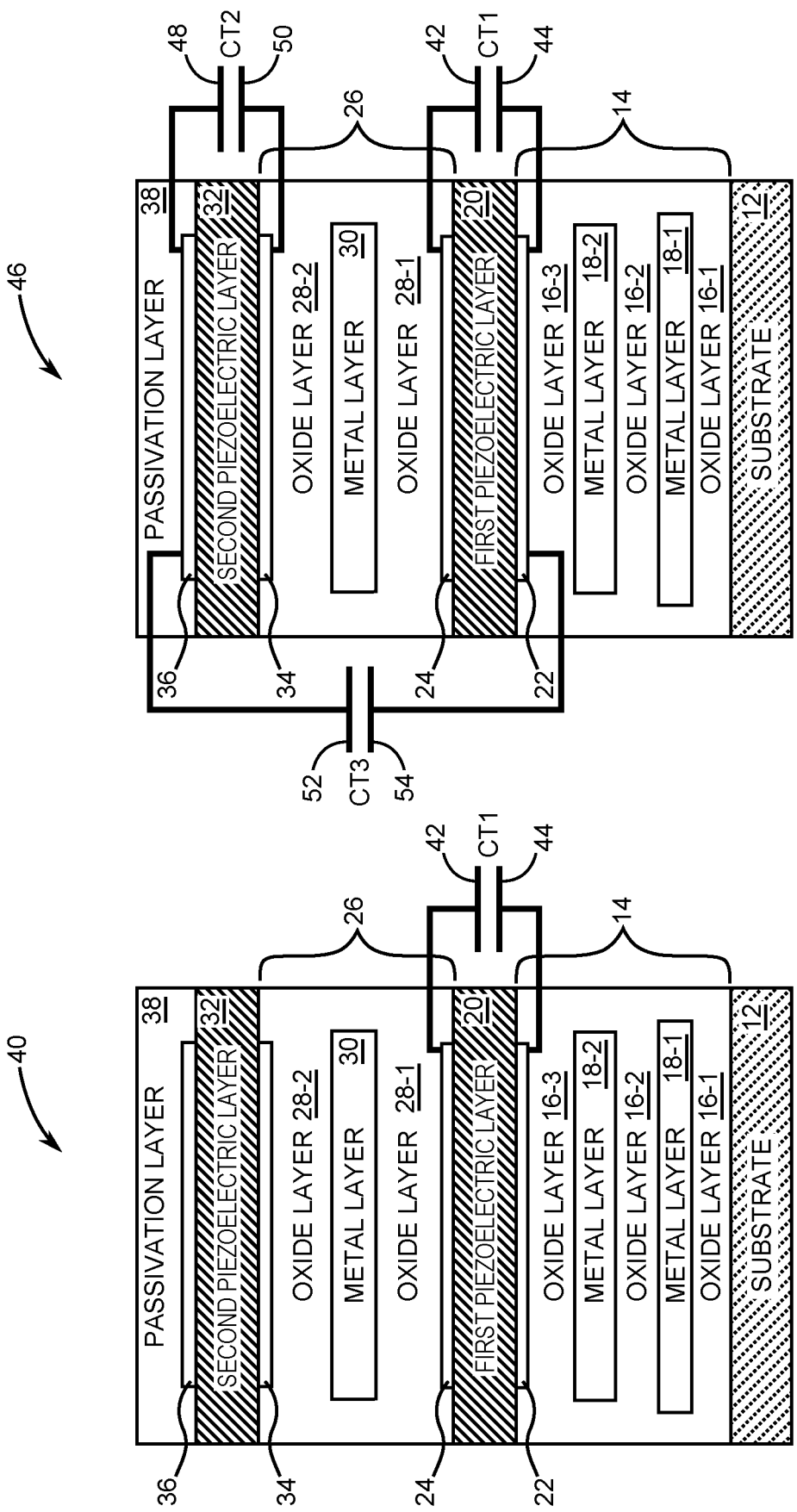
FIG. 3A is a diagram of a cross-section of a first exemplary embodiment of the coupled resonator filter device depicting tuning capacitor connections in accordance with the present disclosure.
FIG. 3B is a diagram of a cross-section of a second exemplary embodiment coupled resonator filter device depicting tuning capacitor connections in accordance with the present disclosure.

FIG. 3A is a diagram of a first exemplary embodiment of a coupled resonator filter device 40 that in accordance with the present disclosure provides for trimming filter response during or after final fabrication process steps. The coupled resonator filter device 40 includes a first tuning capacitor CT1 having a first upper plate 42 coupled to the first upper electrode 24 and a first lower plate 44 coupled to the first lower electrode 22. The first tuning capacitor CT1 provides a filter response tuning behavior that is like that for a change in the thickness of metal layer 30, but opposite in direction regarding the correlation of return loss and bandwidth behavior. In some embodiments, the capacitance range for the first tuning capacitor CT1 is between 0.01 picofarads and 1.0 picofarads. In other embodiments, the capacitance range for the first tuning capacitor CT1 is between 0.01 picofarads and 0.5 picofarads. In yet other embodiments, the capacitance range for the first tuning capacitor CT1 is between 0.5 picofarads and 1.0 picofarads. Note that for a thinner second coupling layer the center lobe goes up and bandwidth becomes wider. In contrast when the center lobe goes up, the bandwidth becomes narrower for a thinner coupling dielectric or a larger capacitance for the first tuning capacitor CT1.

Figure 4:
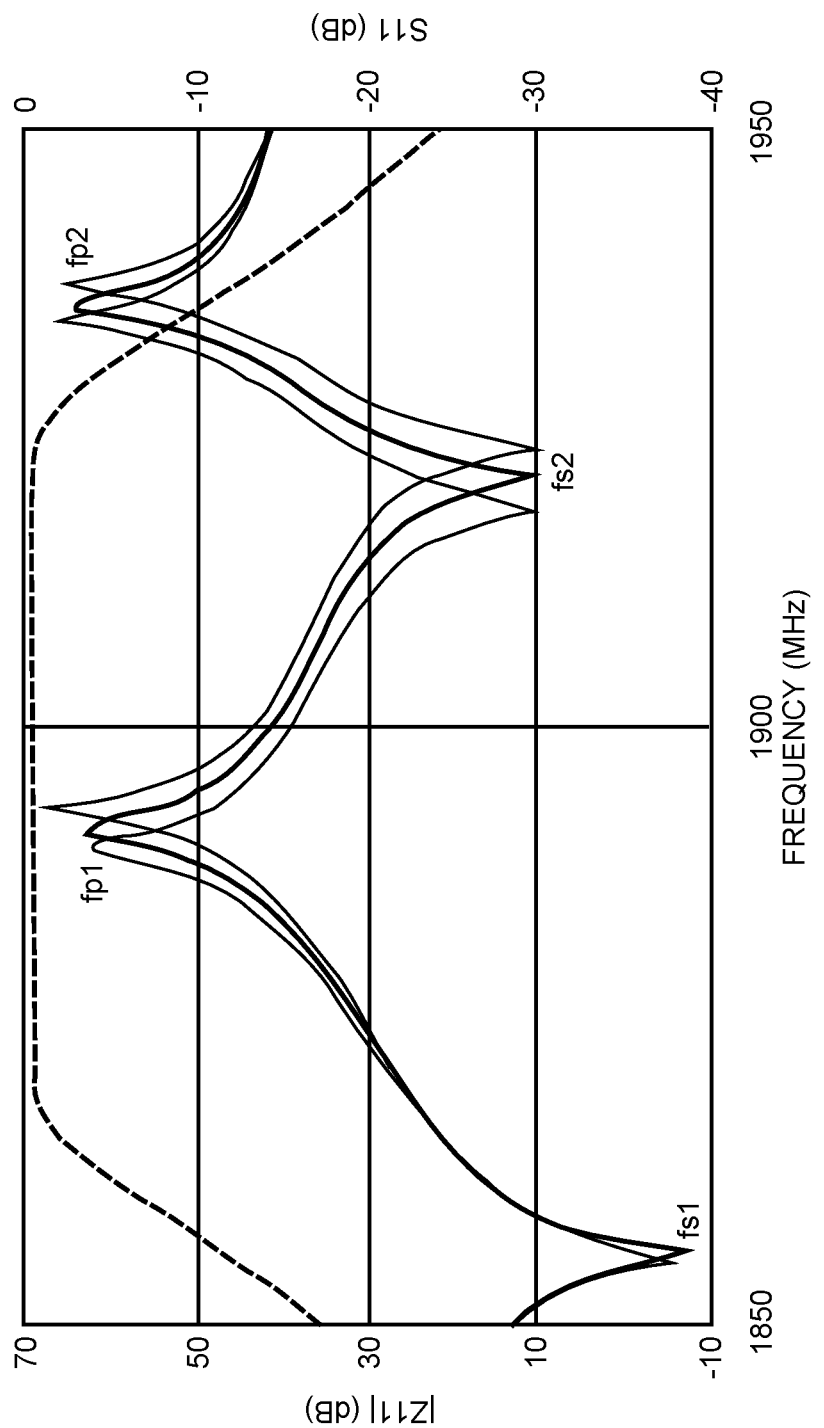
FIG. 4 is graph showing effects of the tuning capacitance of impedance of the coupled resonator filter device and scattering parameter S21 over frequency.

For example, when the first tuning capacitor CT1 is electrically coupled in parallel with the first piezoelectric layer 20, the electrical boundary conditions of the coupled resonator filter device 40 are changed. In other words, the first tuning capacitor CT1 provides a change in effective coupling, wherein the coupling is decreased compared with an intrinsic coupling. As shown in FIG. 4, this change in effective coupling alters the frequency positions of resonance frequencies and thus the bandwidth and return loss of the coupled resonator filter device 40. Insight into the impact of the first tuning capacitor CT1 on the resonances fs1, fp1, fs2, and fp2 can be gained by examining the impedance curve of FIG. 4 for a single stage of the coupled resonator filter device 40. This behavior in impedance suggests that the first tuning capacitor CT1 can be constructed to provide a capacitance that counteracts an offset in the thickness of the metal layer 30 so that a balanced return loss with a desirable predetermined center lobe is achievable. However, the improved return loss comes with a trade-off in slightly degraded bandwidth. On the other hand, if the tuning capacitor is used to fine tune the bandwidth, a degradation of the return loss is to be expected. Selection of capacitance value for the first tuning capacitor CT1 depends on specification requirements that a product must fulfill for a particular application.

In this regard, FIGS. 5A, 5B, and 5C depict effects of capacitance of the first tuning capacitor CT1 on return loss and bandwidth for a target capacitance value, a lower than target capacitance value, and a higher than target capacitance value, respectively. The thickness of the second coupling layer remains unchanged for FIGS. 5A, 5B, and 5C. FIG. 5A depicts the return loss and bandwidth for a target capacitance of 0.25 picofarads for the first tuning capacitor CT1. Notice that peaks of a return loss curve depicted in thick solid line have a left lobe, a center lobe, and a right lobe that line up directly beneath a return loss specification limit depicted as an open box filled with short diagonal lines. Moreover, the bandwidth depicted in dashed line meets specification.

In contrast, FIG. 5B depicts the return loss and bandwidth for a lower than target capacitance of 0.05 picofarads for the first tuning capacitor CT1. In this case, the center lobe of the return loss curve falls away from the return loss specification limit. Notice also that the left lobe and the right lob of the return loss curve lifts above the return loss specification. Moreover, the bandwidth begins increasing towards the outside of the bandwidth specification, adding margin towards the specification.

FIG. 5C depicts the return loss and bandwidth for a higher than target capacitance of 0.5 picofarads for the first tuning capacitor CT1. In this case, the center lobe of the return loss curve rises above the return loss specification limit. Notice also that the left lobe and the right lob of the return loss curve fall below the return loss specification. Moreover, the bandwidth begins decreasing towards the inside of the bandwidth specification.

Figure 6A:
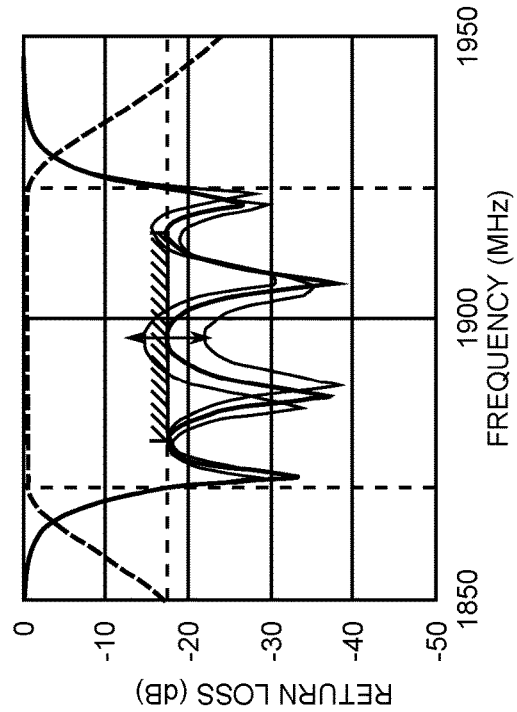
FIG. 6A is a graph depicting filter frequency position and return loss for a second tuning capacitor over a range of tuning capacitance.
Figure 6C:
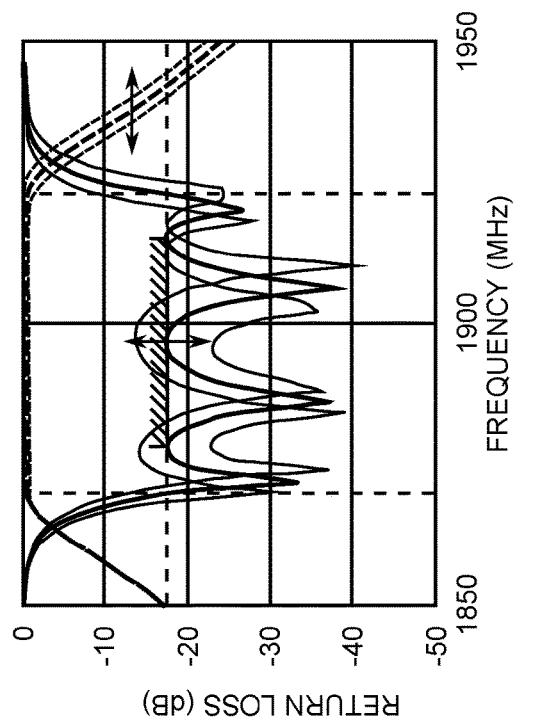
FIG. 6C is a graph showing an example of the impact thickness variation of the second coupling layer.
Figure 6B:
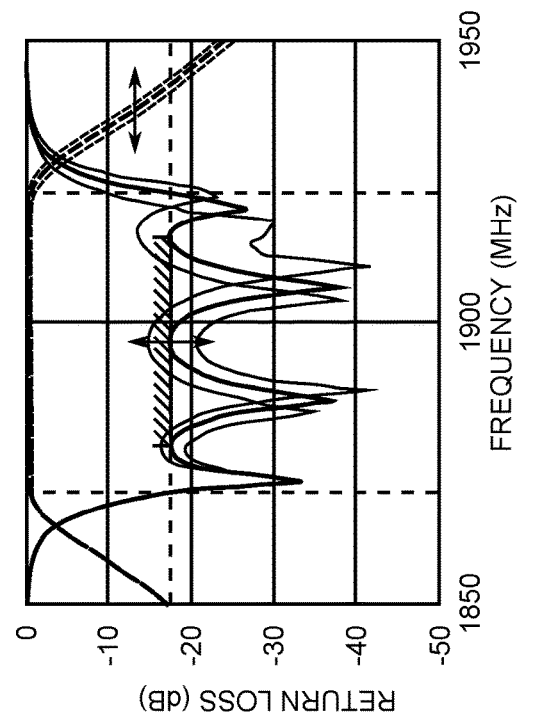
FIG. 6B is a graph depicting filter frequency position and return loss for the first tuning capacitor over a range of tuning capacitance.

A second exemplary embodiment of a coupled resonator filter device 46, depicted in FIG. 3B, shows that a second tuning capacitor CT2 may be electrically coupled in parallel across the second piezoelectric layer 32 in addition to coupling the first tuning capacitor CT1 in parallel with the first piezoelectric layer 20 sandwiched between the acoustic reflector layers 14 and the acoustic coupling layers 26. In this second exemplary embodiment, the second tuning capacitor CT2 has a second upper plate 48 coupled to the second upper electrode 36 and a second lower plate 50 coupled to the second lower electrode 34. As can be seen in the graph of FIG. 6A, the second tuning capacitor CT2 has a lesser effect on the bandwidth of the coupled resonator filter device 46, while still providing a substantial tuning of the return loss performance. In the graph of FIG. 6A, capacitance for the second tuning capacitor CT2 has a target of 0.25 picofarads and is swept between ±0.1 picofarads. The center lobe of the return loss curve falls away from the return loss specification limit for lower capacitance and rises above the return loss specification limit for higher capacitance. Notice that the bandwidth remains stable for these capacitance variations for the second tuning capacitor CT2. For comparison, FIG. 6B is a graph of capacitance variation effects on bandwidth and return loss for the first tuning capacitor CT1. In the graph of FIG. 6B, capacitance for the first tuning capacitor CT1 has a target of 0.25 picofarads and is swept between 0.05 picofarads and 0.5 picofarads. The composite results of FIG. 6B are consistent with the individual results depicted in the graphs of FIGS. 5A, 5B, and 5C, respectively. The graph of FIG. 6C is provided for comparison with the effects of thickness variations of the metal layer 30. The composite results of FIG. 6C are consistent with the individual results depicted in the graphs of FIGS. 2A, 2B, and 2C, respectively.

Returning to FIG. 3B, other electrical connections for tuning capacitors are available. For example, a third tuning capacitor CT3 has a third upper plate 52 coupled to the second upper electrode 36 and a third lower plate 54 coupled to first lower electrode 22. The third tuning capacitor CT3 may be used in conjunction with either or both of the first tuning capacitor CT1 and the second tuning capacitor CT2 to change electrical boundary conditions and thereby further trim the frequency response of the coupled resonator filter device 46. In some embodiments, the capacitance range for the third tuning capacitor CT3 is between 0.01 picofarads and 0.5 picofarads. In other embodiments, the capacitance range for the third tuning capacitor CT3 is between 0.01 picofarads and 0.25 picofarads. In yet other embodiments, the capacitance range for the third tuning capacitor CT3 is between 0.25 picofarads and 0.5 picofarads.

Figure 7:
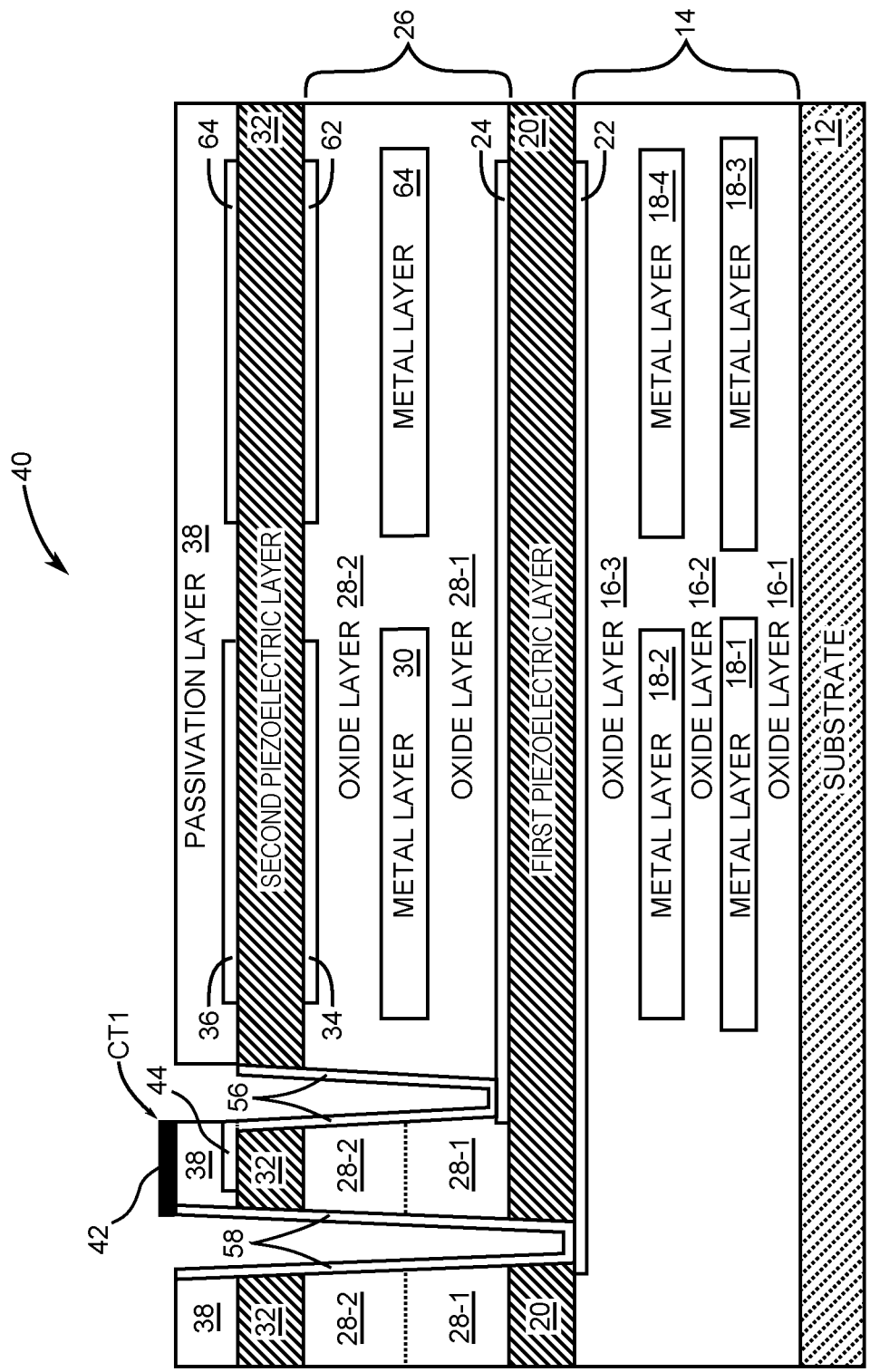
FIG. 7 is a diagram of a detailed cross-section of the first exemplary embodiment of the coupled resonator filter device depicted in FIG. 3A.

FIG. 7 is a diagram of a detailed cross-section of the first exemplary embodiment of the coupled resonator filter device 40 depicted in FIG. 3A. In this exemplary embodiment, the first tuning capacitor CT1 is integrated as an on-chip element. In particular, the first tuning capacitor CT1 has a passive metal-insulator-metal structure.

As shown in FIG. 7, the upper plate 42 is disposed over the passivation layer 38, and the first lower plate 44 is buried under the passivation layer 38. The first upper plate 42 made be constructed from a pad metal layer that includes but is not limited to under bump metallization. A portion of the passivation layer 38 sandwiched between the first upper plate 42 and the first lower plate 44 makes up the dielectric of the first tuning capacitor CT1. In this version of the coupled resonator filter device 40, the first lower plate 44 is electrically coupled to the first upper electrode 24 by way of a first via metal 56. The first upper plate 42 is electrically coupled to the first lower electrode 22 by way of a second via metal 58. The version of the coupled resonator filter device 40 depicted in FIG. 7 is of a two-stage type with additional reflective metal layers 18-3 and 18-4 along with one additional coupling metal layer 60. A third lower electrode 62 and a third upper electrode 64 sandwiches the second piezoelectric layer 32.

Fabrication of the tuning capacitors such as the first tuning capacitor CT1 as an on-chip element allows tuning of the tuning capacitors during a standard chip fabrication process while receiving direct feedback from the final product filter response. Also, having the tuning capacitors on the chip saves space compared with alternatives (e.g., surface mount device (SMD) capacitors on the laminate). However, it is to be understood that embodiments of the present disclosure include an SMD-type capacitor as the first tuning capacitor CT1 and electrically coupling the SMD capacitor in parallel with the first piezoelectric layer 20 by way of the first via metal 56 and the second via metal 58.

Fabricating and tuning the capacitance of a tuning capacitor such as the first tuning capacitor CT1 on a coupled resonator filter die depends on the electrodes to which the tuning capacitors are to be connected. As depicted in FIG. 7, vias lined with via metal such as the first via metal 56 and second via metal 58 may be required, and the tuning capacitor may be realized by a passive metal-insulator-metal structure. A trim map for the final thickness of the dielectric can be calculated using a filter probe response close to final fabrication process steps where the response of the coupled resonator filter device 40 clearly shows the impact of metal layer thickness variation and the metro data taken during fabrication process. The capacitance of the first tuning capacitor CT1 is then adjusted to a desired value by way of computer simulation. When designing the coupled resonator filter device 40, one designs the acoustic reflector layers 14 and acoustic coupling layers 26 around a processable median value of the capacitor that allows for practical limits for the capacitor tuning through, for example, trimming of the thickness of the passivation layer 38.

As disclosed, the most efficient and balanced return loss performance and bandwidth of coupled resonator filter devices is affected by the acoustic coupling layers in a device stack. Process imperfections lead to return loss and bandwidth variations, which cannot always be fixed by direct trim approaches such as deposition variation in coupling layers. In accordance with the present disclosure, the use of tuning capacitors that are connected to electrical connections of the coupled resonator filter device improves the yield and limits the return loss and/or bandwidth variation over a wafer. The final return loss and bandwidth of a coupled resonator filter device after full process is achieved through adjusting the acousto-electrical boundary conditions of the coupled resonator filter device.

Other approaches are possible to realize an on-chip tunable capacitor (e.g., changing the capacitance by dynamic cap area expose). Also, as mentioned before, in general one could also just add the capacitor on a laminate using, for example, an SMD capacitor. However, regardless of the actual tuning mechanism, the tuning element is detectable in the final coupled resonator filter device.

Further still, various additional embodiments are within the scope of the present disclosure. For example, FIG. 8A is a diagram of a cross-section of a third exemplary embodiment coupled resonator filter device 66 depicting tuning capacitor connections in accordance with the present disclosure. In this third exemplary embodiment, the second tuning capacitor CT2 has the second upper plate 48 coupled to the second upper electrode 36 and the second lower plate 50 coupled to the metal layer 30. In some embodiments, the capacitance range for the second tuning capacitor CT2 is between 0.01 picofarads and 1.0 picofarads. In other embodiments, the capacitance range for the second tuning capacitor CT2 is between 0.01 picofarads and 0.5 picofarads. In yet other embodiments, the capacitance range for the second tuning capacitor CT2 is between 0.5 picofarads and 1.0 picofarads. In this third exemplary embodiment, a fourth capacitor CT4 has a fourth upper plate 70 coupled to the first upper electrode 24 and a fourth lower plate 72 coupled to the metal layer 18-2 of the acoustic reflector layers 14.

FIG. 8B is a diagram of a cross-section of a fourth exemplary embodiment of a coupled resonator filter device 68 depicting tuning capacitor connections in accordance with the present disclosure. In this fourth exemplary embodiment, the fourth capacitor CT4 has the fourth upper plate 70 coupled to the second upper electrode 36 and the fourth lower plate 72 coupled to the first upper electrode 24. In some embodiments, the capacitance range for the fourth tuning capacitor CT4 is between 0.01 picofarads and 1.0 picofarads. In other embodiments, the capacitance range for the fourth tuning capacitor CT4 is between 0.01 picofarads and 0.5 picofarads. In yet other embodiments, the capacitance range for the fourth tuning capacitor CT4 is between 0.5 picofarads and 1.0 picofarads.

It is to be understood that in some embodiments, the acoustic reflector layers 14 and the acoustic coupling layers 26 are not limited to stacks of alternating oxide layers and metal layers. For example, a single reflective layer made of metal or oxide is usable for some applications. Moreover, a single acoustic layer made of metal or oxide is usable for some applications.

Those skilled in the art will recognize improvements and modifications to the preferred embodiments of the present disclosure. All such improvements and modifications are considered within the scope of the concepts disclosed herein and the claims that follow.

What is claimed is:
1. A coupled resonator filter device comprising:
  a substrate;
  one or more acoustic reflector layers disposed over the substrate;
  a first lower electrode disposed over the one or more acoustic reflector layers;
  a first piezoelectric layer disposed over the first lower electrode;

a first upper electrode disposed over the first piezoelectric layer;

one or more acoustic coupling layers disposed over the first upper electrode;

a second lower electrode disposed over the one or more acoustic coupling layers;

a second piezoelectric layer disposed over the second lower electrode;

a second upper electrode disposed over the second piezoelectric layer;

a first tuning capacitor; and a first via metal and a second via metal configured to couple the first tuning capacitor between the first upper electrode and the first lower electrode.

2. The coupled resonator filter device of claim 1 wherein the one or more acoustic reflector layers comprises at least one metal layer.

3. The coupled resonator filter device of claim 1 wherein the one or more acoustic coupling layers comprises at least one metal layer.

4. The coupled resonator filter device of claim 1 wherein the first tuning capacitor has a first lower plate disposed over the second piezoelectric layer and a first upper plate disposed over a passivation layer.

5. The coupled resonator filter device of claim 4 wherein the first upper plate is formed in a pad metal layer.

6. The coupled resonator filter device of claim 4 wherein the first via metal electrically couples the first lower plate to the first upper electrode, and the second via metal electrically couples the first upper plate to the first lower electrode.

7. The coupled resonator filter device of claim 4 wherein the first via metal electrically couples the first upper plate to the first upper electrode, and the second via metal electrically couples the first lower plate to the first lower electrode.

8. The coupled resonator filter device of claim 4 wherein the passivation layer is an oxide layer.

9. The coupled resonator filter device of claim 8 wherein the oxide layer comprises silicon dioxide.

10. The coupled resonator filter device of claim 4 wherein the passivation layer is a nitride layer.

11. The coupled resonator filter device of claim 10 wherein the passivation layer comprises silicon nitride.

12. The coupled resonator filter device of claim 1 wherein the first tuning capacitor has a capacitance that ranges between 0.01 picofarads and 1.0 picofarads.

13. The coupled resonator filter device of claim 1 wherein the first tuning capacitor is a surface mount device.

14. The coupled resonator filter device of claim 1 further comprising a second tuning capacitor that is electrically coupled between the second lower electrode and the second upper electrode.

15. The coupled resonator filter device of claim 14 wherein the second tuning capacitor is a metal-insulator-metal type capacitor having a portion of a passivation layer as a dielectric.

16. The coupled resonator filter device of claim 15 wherein the second tuning capacitor has a capacitance that ranges between 0.01 picofarads and 1.0 picofarads.

17. The coupled resonator filter device of claim 1 further comprising a third tuning capacitor that is electrically coupled between the first lower electrode and the second upper electrode.

18. The coupled resonator filter device of claim 17 wherein the third tuning capacitor has a capacitance that ranges between 0.01 picofarads and 0.5 picofarads.

19. The coupled resonator filter device of claim 17 wherein the third tuning capacitor is a metal-insulator-metal type capacitor having a portion of a passivation layer as a dielectric material.

20. The coupled resonator filter device of claim 17 further comprising a fourth tuning capacitor that is electrically coupled between the second upper electrode and the first upper electrode.

21. The coupled resonator filter device of claim 1 wherein the coupled resonator filter device is a two-stage coupled resonator filter.

22. The coupled resonator filter device of claim 1 further comprising a second tuning capacitor that is electrically coupled between the second upper electrode and a metal layer of the acoustic coupling layers.

23. The coupled resonator filter device of claim 1 further comprising a second tuning capacitor that is electrically coupled between the first upper electrode and a metal layer of the acoustic reflector layers.

* * * * *